US012771302B2

(12) United States Patent
Chang et al.

(10) Patent No.: US 12,771,302 B2
(45) Date of Patent: Oct. 20, 2026

(54) SYSTEM, METHOD, CIRCUIT, AND DEVICE FOR MILLIMETER-WAVE MULTI-STAGE AMPLIFIER WITH INDUCTIVE COUPLING

(71) Applicant: Taiwan Semiconductor Manufacturing Company, Ltd., Hsinchu (TW)

(72) Inventors: Wei Ling Chang, Hsinchu County (TW); Hsieh-Hung Hsieh, Taipei City (TW); Tzu-Jin Yeh, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 828 days.

(21) Appl. No.: 17/836,359

(22) Filed: Jun. 9, 2022

(65) Prior Publication Data

US 2023/0402975 A1 Dec. 14, 2023

(51) Int. Cl.

| | |
|---|---|
| ***H03F 3/19*** | (2006.01) |
| ***H03F 1/22*** | (2006.01) |
| ***H03F 1/34*** | (2006.01) |
| ***H03F 1/56*** | (2006.01) |
| ***H03F 3/24*** | (2006.01) |

(52) U.S. Cl.

CPC ............... *H03F 3/19* (2013.01); *H03F 1/223* (2013.01); *H03F 1/347* (2013.01); *H03F 1/565* (2013.01); *H03F 3/245* (2013.01); *H03F 2200/222* (2013.01); *H03F 2200/318* (2013.01); *H03F 2200/387* (2013.01); *H03F 2200/451* (2013.01)

(58) Field of Classification Search

CPC ...... H03F 3/19; H03F 1/565; H03F 2200/222; H03F 2200/387; H03F 2200/318; H03F 2200/451; H03F 1/347; H03F 1/223; H03F 3/245

USPC .......................................................... 330/291

See application file for complete search history.

(56) References Cited

U.S. PATENT DOCUMENTS

| | | | | |
|---|---|---|---|---|
| 3,289,074 A * | 11/1966 | Jones | G01R 27/2694 324/528 |
| 10,277,170 B1 * | 4/2019 | Liang | H03F 3/193 |
| 2022/0021354 A1 * | 1/2022 | Jiang | H03F 1/223 |
| 2022/0311391 A1 * | 9/2022 | Medra | H03G 3/001 |
| 2022/0337205 A1 * | 10/2022 | Fard | H03F 1/0222 |

FOREIGN PATENT DOCUMENTS

| | | | |
|---|---|---|---|
| CN | 1354905 A * | 6/2002 | H03H 7/1775 |
| CN | 104702223 A * | 6/2015 | H03G 3/3052 |
| CN | 105375886 A * | 3/2016 | |
| CN | 105375886 B * | 2/2018 | |

(Continued)

*Primary Examiner* — Andrea Lindgren Baltzell
*Assistant Examiner* — Lance Torbjorn Bartol
(74) *Attorney, Agent, or Firm* — Foley & Lardner LLP

(57) ABSTRACT

In some aspects of the present disclosure, a millimeter-wave amplifier circuit is disclosed. The millimeter-wave amplifier circuit includes a first amplifier, a first inductor coupled to an output of the first amplifier, a second amplifier coupled to the output of the first amplifier and a second inductor coupled to an output of the second amplifier. The second inductor electro-magnetically couples to the first inductor to send a first signal substantially in-phase with a second signal generated at the output of the first amplifier.

20 Claims, 10 Drawing Sheets

200A

(56) References Cited

FOREIGN PATENT DOCUMENTS

| | | | | | |
|---|---|---|---|---|---|
| CN | 108701674 | A | * | 10/2018 | .............. A61P 31/16 |
| CN | 114362681 | A | * | 4/2022 | |
| DE | 112016002976 | T5 | * | 4/2018 | ............... G06K 7/10 |
| DE | 102020001516 | A1 | * | 10/2020 | ......... H03F 3/45089 |
| KR | 20220067137 | A | * | 5/2022 | ............. H10D 84/83 |

* cited by examiner

200A

200B

300

500

700

800

SYSTEM, METHOD, CIRCUIT, AND DEVICE FOR MILLIMETER-WAVE MULTI-STAGE AMPLIFIER WITH INDUCTIVE COUPLING

BACKGROUND

Radio frequency (RF) and millimeter wave (mm-wave) integrated circuits (ICs) enable key applications in our life, such as wireless communication (e.g., 4G/5G mobile communication, wireless land-area networks (LANs), low-data-rate low-power communication, and near-field communication (NFC)), industrial automation (e.g., Internet-of-things devices (IoTs), high-precision positioning sensors), automotive safety (e.g., vehicular radar sensors, advanced driver-assistance systems (ADAs)), and medical instrumentations (non-ionizing imaging systems, wearable sensors, implanted devices, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
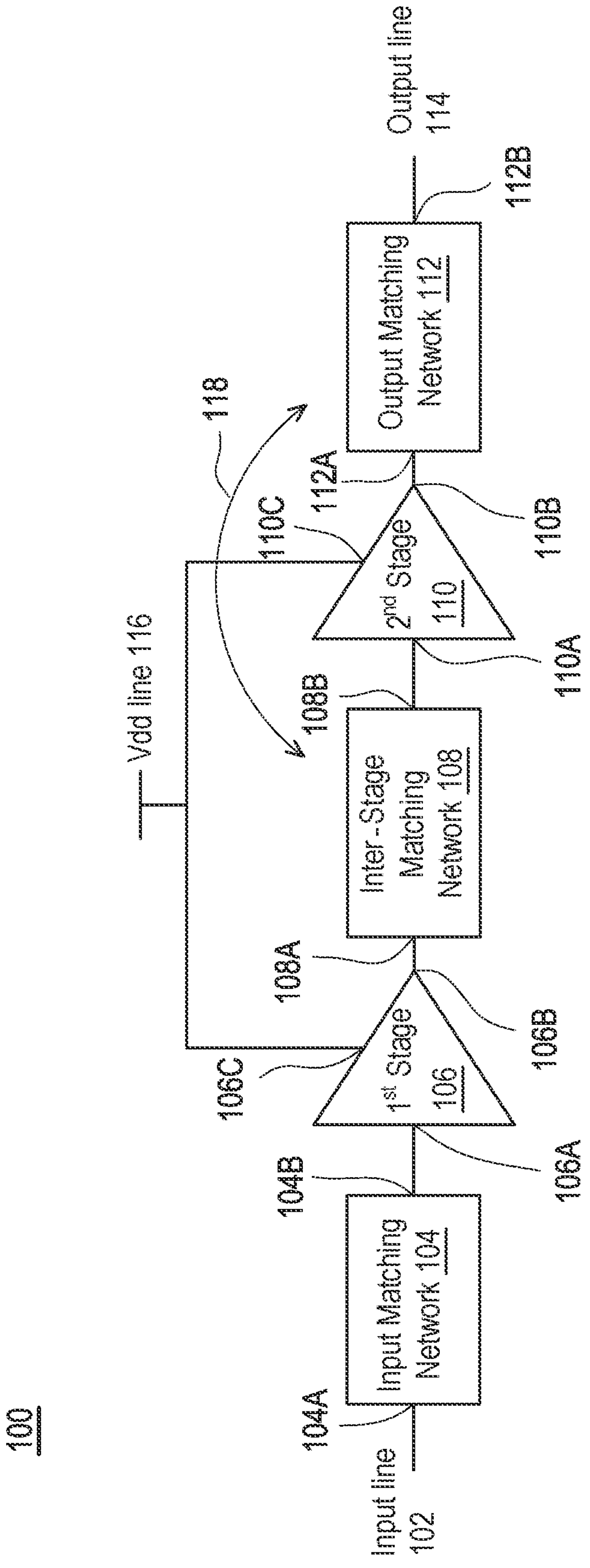
FIG. 1 illustrates a block diagram of a two-stage amplifier system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For millimeter-wave operation, such as CMOS millimeter-wave operation, due to lossy substrate causing restricted device capability, which can be evaluated using frequency-gain figures of merit such as fT and the fmax, the gain performance is limited. Adding gain stages can increase direct-current (DC) power consumption and certain types of feedback introduce potential stability issues.

The present disclosure provides a multi-stage amplifier with transformer-based feedback across adjacent gain stages. The transformer can be realized as two co-planar inductors, where one of the planar inductors is a load of a first stage and a second one of the planar inductors is a load of the second stage. In some embodiments, the innovative in-phase coupling is proposed to effectively boost the gain without increasing the DC power consumption. The co-planar configuration can be used to achieve a desired magnitude of the coupling factor. In some embodiments, the specific feedback topology and the magnitude of the coupling factor ensure stability.

FIG. 1 illustrates a block diagram of a two-stage amplifier system 100, in accordance with some embodiments of the present disclosure. The two-stage amplifier system 100 may be adapted to amplify millimeter-wave, microwave, or radio frequency signals. The frequency of operation can be 70 GHz to 90 GHz, 20 GHz to 30 GHz, 10 GHz to 100 GHz, 100 GHz to 1 THz, 500 MHz to 10 GHz, 500 MHz to 100 GHz, or some other bandwidth. The frequency of operation can be fixed or adjustable by hardware or software, including by filter and digital logic configurations. The system 100 includes an input line 102 to receive an input signal. The system 100 includes an input matching network 104 coupled to the input line 102. The input matching network 104 includes an input port 104A and an output port 104B. The input matching network 104 may match an impedance of a load coupled to 104A to an impedance of load coupled to the output port 104B. The load of the input port 104A may be an antenna, a filter, a duplexer, a triplexer, a switch module, or any other component or circuit in series with the input line 102 while remaining within the scope of the disclosure. The load of the output port 104B is a first-stage amplifier 106. Matching the load of the input port 104A to the load of the output port 104B may refer to having a return loss (e.g., s-parameters S11 and S22) of −10 dB or less (i.e., −11 dB, −12 dB, etc.), −20 dB or less, or any other values for return loss while remaining within the scope of the disclosure.

The system 100 includes the first-stage amplifier 106 coupled to the input matching network 104. The first-stage amplifier 106 includes an input port 106A coupled to the output port 104B, an output port 106B, and a voltage supply (VDD) port 106C. The first-stage amplifier 106 receives a matched signal from the input matching network 104 and amplifies the matched signal to generate an amplified signal at the output port 106B.

The system 100 includes an inter-stage matching network 108 coupled to the first-stage amplifier 106. The inter-stage matching network 108 includes an input port 108A and an output port 108B. The inter-stage matching network 108 may match an impedance of a load coupled to 108A (e.g., the first-stage amplifier 106) to an impedance of load coupled to the output port 108B (e.g., a second-stage amplifier 110).

The system 100 includes the second-stage amplifier 110 coupled to the inter-stage matching network 108. The second-stage amplifier 110 includes an input port 110A coupled to the output port 108B, an output port 110B, and a VDD port 110C. The second-stage amplifier 110 receives a matched signal from the inter-stage matching network 108 and amplifies the matched signal to generate an amplified signal at the output port 110B.

The system 100 includes an output matching network 112 coupled to the second-stage amplifier 110. The output matching network 112 includes an input port 112A and an output port 112B. The output matching network 112 may match an impedance of a load coupled to 112A (e.g., the second-stage amplifier 110) to an impedance of load coupled to the output port 112B. The system 100 includes an output line 114 coupled to the port 112B. The load of the output port 112B may be an antenna, a filter, a down-converting mixer, an analog-to-digital converter, or any other component or circuit in series with the output line 114 while remaining within the scope of the disclosure.

The system 100 includes a voltage supply (VDD) line 118. The VDD line 116 is coupled to the VDD port 106C and the VDD port 110C. The VDD line 116 may receive a voltage supply signal from a voltage supply coupled to the VDD line 116.

The system 100 includes a coupling 118. The coupling 118 may be referred to as an electro-magnetic coupling or a feedback coupling. The coupling 118 can include magnetic fields. In some embodiments, the coupling 118 couples the output matching network 112 to the inter-stage matching network 108. In some embodiments, the coupling 118 provides in-phase, or substantially in-phase coupling within the frequency of operation or a portion of the frequency of operation. That is, in some embodiments, the output matching network 112 sends a first signal to the inter-stage matching network 108 and the first signal is in-phase, or substantially in-phase, with a second signal generated at the output of the first-stage amplifier 106, within the frequency of operation or a portion of the frequency of operation. Substantially in-phase can be defined as being within 1 degree, 5 degrees, 10 degrees, or within any other value less than 45 degrees while remaining within the scope of the disclosure. The mechanism by which the signal is provided substantially in-phase may be that a signal is inverted (e.g., shifted by 180 degrees), or substantially inverted, when being amplified by the second-stage amplifier 110, and inverted, or substantially inverted, again when being coupled via the coupling 118. The coupling 118 may cause a gain of the second-stage amplifier 110 to increase. That is, a gain of second-stage amplifier 110 with the output matching network 112 coupled to the inter-stage matching network 108 via the coupling 118 is greater than a gain of the second-stage amplifier 110 without the output matching network 112 coupled to the inter-stage matching network 108 via the coupling 118. In some embodiments, the gain of the second-stage amplifier 110 with the coupling 118 is at least 1 dB, 2 dB, 3 dB, 4 dB, 5 dB, 6 dB, or any other value greater than the gain of the second-stage amplifier 110 without the coupling 118 while remaining within the scope of the disclosure.

Figure 2A:
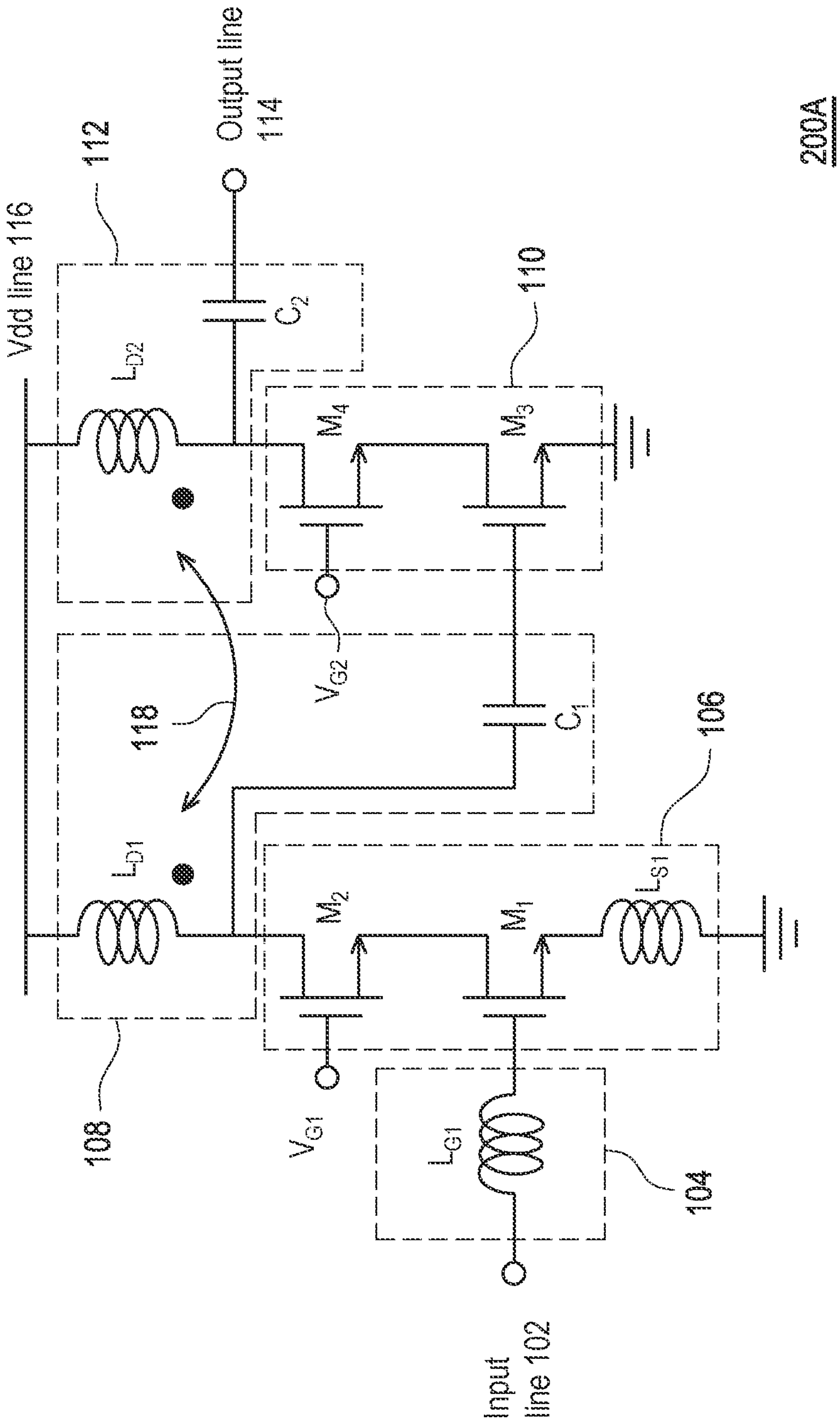
FIGS. 2A-2B illustrate circuit diagrams of two-stage amplifier circuits, in accordance with some embodiments of the present disclosure.

FIG. 2A illustrates a circuit diagram of a two-stage amplifier circuit 200A, in accordance with some embodiments of the present disclosure. The circuit 200A can be a circuit implementation of the system 100. The circuit 200A includes the input line 102, the input matching network 104, the first-stage amplifier 106, the inter-stage matching network 108, the second-stage amplifier 110, and the output matching network 112, the output line 114, the VDD line 116, and the coupling 118. The input matching network 104 includes an inductor LG1. One end of LG1 is coupled to the input line 102 and the other end of LG1 is coupled to the first-stage amplifier 106.

The first-stage amplifier 106 includes a transistor M1, a transistor M2 coupled to the transistor M1, and an inductor LS1 coupled to the transistor M1. The two transistors M1 and M2 can be referred to as a cascode configuration, wherein M1 is a common-source transistor and M2 is a cascode transistor. The cascode configuration can improve reverse isolation, which can improve stability and simplify matching.

The transistor M1 includes a gate port coupled to the inductor LG1, a drain port coupled to the transistor M2, and a source port coupled to the inductor LS1. The transistor M1 may include a substrate port. In some embodiments, the substrate port is coupled to ground. In some embodiments, the transistor M1 is a deep n-well transistor, and additionally includes a p-well port and a deep n-well port. The p-well port can be coupled to the source port, the deep n-well port can be coupled to the VDD line 116. The deep n-well transistor can isolate M1 from the substrate, reduce substrate noise, and reduce the body-effect.

The transistor M2 includes a gate port coupled to a bias line VG1, a source port coupled to the transistor M1, and a drain port coupled to the inter-stage matching network 108. The transistor M2 may include a substrate port. In some embodiments, the substrate port is coupled to ground. In some embodiments, the transistor M2 is a deep n-well transistor, and additionally includes a p-well port and a deep n-well port. The p-well port can be coupled to the source port, the deep n-well port can be coupled to the VDD line 116. The deep n-well transistor can isolate M2 from the substrate, reduce substrate noise, and reduce the body-effect, which may be particularly large for M2 because of the voltage difference between the source port of M2 and ground.

The inductor LS1 provides feedback to the gate-source voltage of M1, which can be referred to as the input of M1. Thus, the circuit 200A includes two feedbacks, one via inductor LS1 and a second one via the coupling 118. The inductor LS1 can be selected to improve matching of the input matching network 104. The inductor LS1 is coupled at one end to the transistor M1 and at the other end to ground.

The inter-stage matching network 108 includes an inductor LD1 and a capacitor C1. The inductor LD1 can provide a passband at the frequency of operation, or a portion thereof, based on the inductor resonating with a capacitance included in, or coupled to, the inductor LD1. For example, the capacitance may include the parasitic capacitance of the inductor LD1. Additionally or alternatively, the capacitance may include one or more on-chip capacitors. The one or more on-chip capacitors may be fixed or adjustable with digital logic. The inductor LD1 is coupled at one end to the first-stage amplifier 106 and the capacitor C1. The inductor LD1 is coupled at the other end to the VDD line 116. The capacitor C1 can couple an AC portion of the amplified signal from the first-stage amplifier 106 to the second-stage amplifier 110. The capacitor C1 is coupled at one end to the inductor LD1 and at the other end to the second-stage amplifier 110.

The second-stage amplifier 110 includes a transistor M3 and a transistor M4. The transistor M3 includes a gate port coupled to the capacitor C1, a drain port coupled to the transistor M4, and a source port coupled to ground. The transistor M4 includes a gate port coupled to a bias line VG2, a source port coupled to the transistor M3, and a drain port coupled to the output matching network 112.

The output matching network 112 includes an inductor LD2 and a capacitor C2. The inductor LD2 can provide a passband at the frequency of operation, or a portion thereof, in a way similar to the way LD1 does. The inductor LD2 is coupled at one end to the second-stage amplifier 110 and the capacitor C2. The inductor LD2 is coupled at the other end to the VDD line 116. The inductor LD2 is (e.g., electro-magnetically) coupled to the inductor LD1 via the coupling 118. The coupling 118 between the inductors LD2 and LD1 can be referred to as feedback coupling because a signal is being fed back from the output matching network 112 to the inter-stage matching network 108. The signal being fed back to the inter-stage matching network 108 can be comparable to a signal being generated by the first-stage amplifier 106 and provided at an output of the first-stage amplifier 106 to the inductor LD1. For example, the signal being fed back may be at least 0.1 of the magnitude of the signal being generated by the first-stage amplifier 106 or any magnitude while remaining in the scope of the present disclosure. In some embodiments, the inductor LD2 electro-magnetically couples to the inductor LD1 the fed-back signal substantially in-phase with the signal being generated by the first-stage amplifier 106. The coupling 118 can be associated with a coupling factor. The coupling factor of the coupling 118 may be 0.01 to 0.05, 0.01 to 0.1, or any other range of values while remaining within the scope of the disclosure. Restricting the coupling factor to the aforementioned range can avoid stability issues. The capacitor C2 can couple an AC portion of the amplified signal in a similar way that the capacitor C1 does. The capacitor C2 is coupled at one end to the inductor LD2 and at the other end to the output line 114.

Figure 2B:
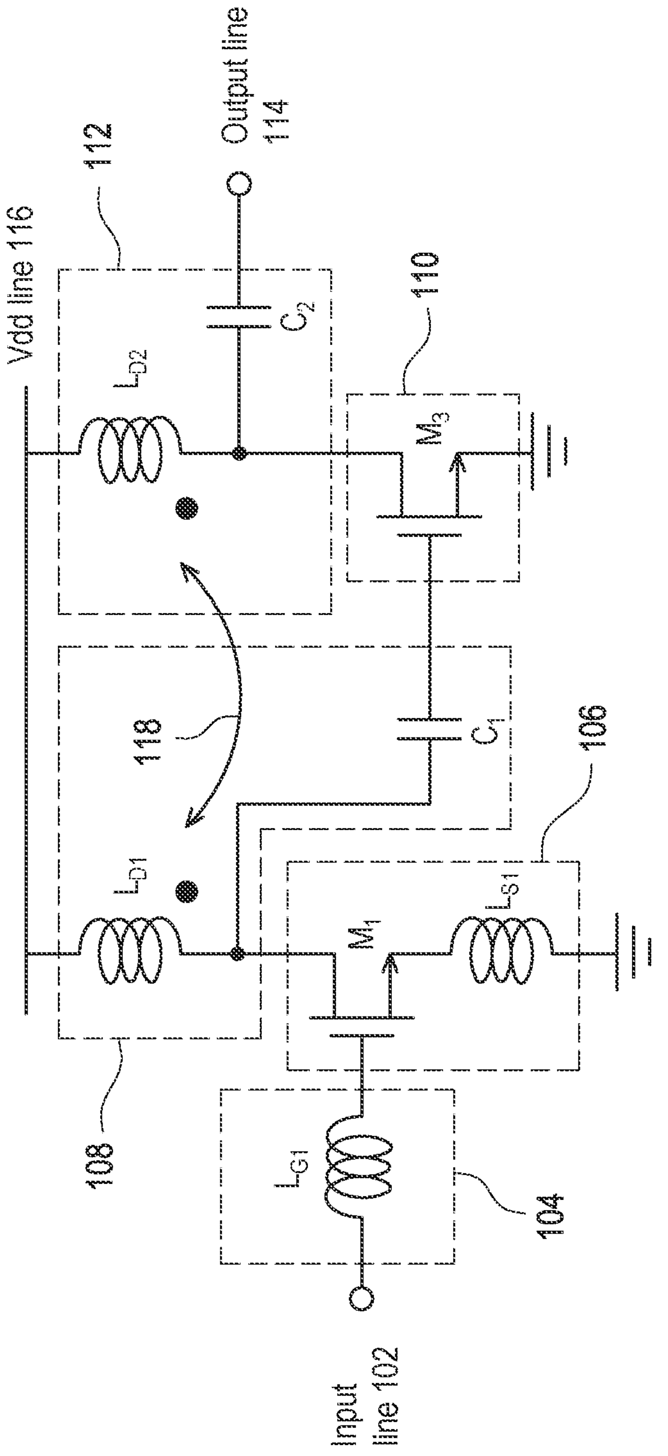

FIG. 2B illustrates a circuit diagram of a two-stage amplifier circuit 200B, in accordance with some embodiments of the present disclosure. The circuit 200B is similar to the circuit 200A except that the circuit 200B includes a common-source configuration instead of a cascode configuration. The common-source configuration can improve linearity. The common-source configuration means that the first-stage amplifier 106 does not have a transistor M2, and the transistor M1 couples directly to the inductor LD1. Likewise, the common-source configuration means that the second-stage amplifier 110 does not have a transistor M4, and the transistor M3 couples directly to the inductor LD2. In some embodiments, one of the stages can have a cascode configuration and the other stage can have a common-source configuration.

Figure 3A:
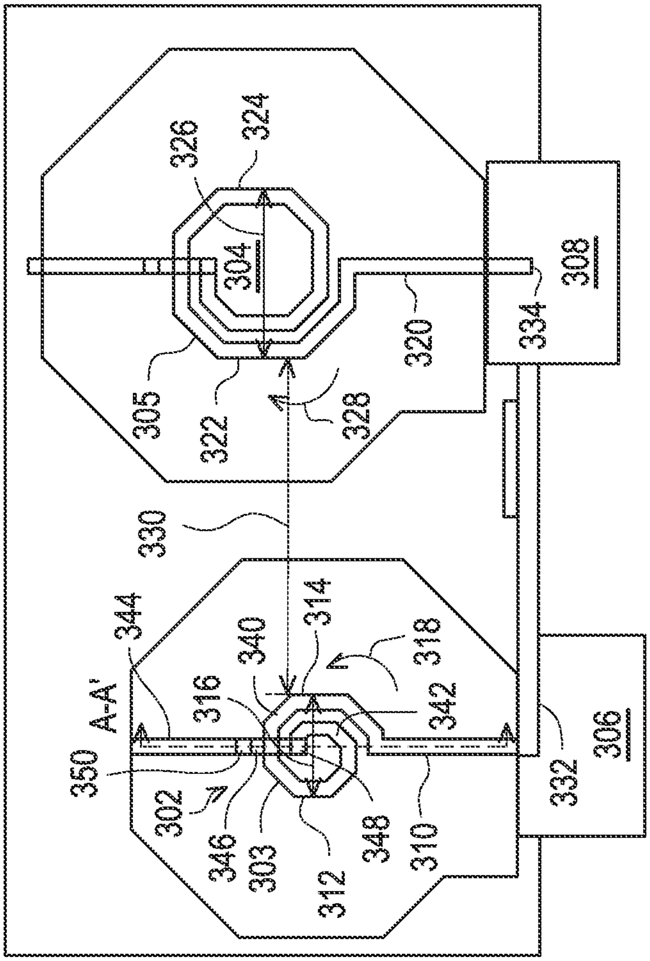
FIG. 3A illustrates a two-stage amplifier device, in accordance with some embodiments of the present disclosure.

FIG. 3A illustrates a two-stage amplifier device 300, in accordance with some embodiments of the present disclosure. The device 300 can be a physical implementation of the system 100 and either the circuit 200A or the circuit 200B. For example, the device 300 can be a post-fabrication embodiment of the system 100 and either the circuit 200A or the circuit 200B. The device 300 can be part of an integrated circuit (IC), 2.5D IC, a 3D IC, wafer level packaging, an integrated fan-out (InFO) wafer level packaging, or any other chip technology while remaining in the scope of the present disclosure. The device 300 can be fabricated on silicon and/or other material while remaining in the scope of the present disclosure.

The device 300 includes a planar inductor 302, a planar inductor 304, an active device 306, and an active device 308.

The planar inductor 302 can be on one metal layer, except for any underpass. The planar inductor 302 includes a spiral portion 303 that can be described as having a spiral shape. The spiral portion 303 can be on the one metal layer. The spiral portion 303 may have a circular, square, rectangular, octagonal, lemniscate (e.g., FIG. 8) shape, or any other shape while remaining in the scope of the present disclosure. The spiral portion 303 can be a size in the range of 50 um-50 um to 100 um-100 um or any other size while remaining in the scope of the present disclosure. The spiral portion can have a number of loops. For example, the planar inductor 302 has an outer loop 340 and an inner loop 342, although the planar inductor 302 can have greater than or less than two loops without departing from the scope of the present disclosure.

The planar inductor 302 may comprise aluminum, copper, or other conductive material. The planar inductor 302 includes an input metal 310 that extends in a second direction (e.g., Y-direction) to couple to the active device 306. The planar inductor 302 includes a metal 344 that may extend opposite the second direction to couple to a voltage supply or voltage regulator. The planar inductor 302 includes an underpass 346 that couples the inner loop 342 to the metal 344. The planar inductor 302 includes a via 348 that couples the underpass 346 to the inner loop 342 and a via 350 that couples the underpass 346 to the metal 344.

The planar inductor 302 includes an edge 312 and an edge 314 opposite the edge 312. The planar inductor 302 includes a distance 316, along a first direction (e.g., the X-direction) from the edge 312 to the edge 314. A reference current that flows through the spiral portion 303, via the input metal 310, in a rotation direction 318, although it is understood that the alternating (AC) current can flow from the input metal 310 to the spiral portion 303 or from the spiral portion to the input metal 310. The planar inductor 302 may be a physical embodiment of the inductor LD1 of FIG. 2A.

The planar inductor 304 can be on one metal layer, except for any underpass. The planar inductors 302 and 304 can be co-planar. That is, the planar inductors 302 and 304 can be on a same metal layer (except any underpasses are on a same second metal layer). The planar inductor 304 includes a spiral portion 305 that can be described as having a spiral shape. The spiral portion 305 can be on the one metal layer. The spiral portions 303 and 305 can be co-planar. The spiral portion 305 can be similar in size, shape, and material as the spiral portion 303, or can be different in size, in shape, in material, or in a combination thereof, from the spiral portion 303. In some embodiments, the planar inductor 304 includes an input metal 320 that extends in the second direction to couple to the active device 308 such that the active devices 306 and 308 are on the same side of the planar inductors 302 and 304. In some embodiments, the planar inductor 304 includes an input metal 320 that extends in a third direction (e.g., opposite the second direction) to couple to the active device 308 such that the active devices 306 and 308 are on opposite sides of the planar inductors 302 and 304. The planar inductor 304 includes an edge 322 and an edge 324 opposite the edge 322. The edge 322 faces the edge 314 of the planar inductor 302. The planar inductor 304 includes a distance 326, along the first direction from the edge 322 to the edge 324. The reference current that flows through the spiral portion 305, via the input metal 320, in a rotation direction 328. Thus, the rotation direction 328 of the spiral portion 305 is opposite of the rotation direction 318 of the spiral portion 303 (given a same direction of reference currents in the respective input metals relative to the respective spiral portions). The planar inductor 304 may be a physical embodiment of the inductor LD2 of FIG. 2A.

The device 300 includes a distance 330, in a first direction between the edge 314 and the edge 322. In some embodiments, the distance 330 is in a range between 100 um and 200 um, or any other range of values while remaining in the scope of the present disclosure. In some embodiments, the distance 330 is greater than each of the distances 316 and 326, at least twice as long as each of the distances 316 and 326, or any other values relative to each of the distances 316 and 326 while still remaining in the scope of the present disclosure.

The active device 306 includes an output metal 332 that couples to the planar inductor 302. The active device 306 may be a physical embodiment of the first-stage amplifier 106 of FIG. 1. The active device 308 includes an output metal 334 that couples to the planar inductor 304. The active device 308 may be a physical embodiment of the second-stage amplifier 110 of FIG. 1. Each of the active devices 308 may be as a complementary metal-oxide-silicon (CMOS) transistor, a Silicon-on-insulate (SOI) transistor, a Gallium Arsenide (GaAs) transistor, a silicon germanium (SiGe) transistor, a bipolar (BJT) transistor, a bipolar CMOS (BiCMOS) transistor, or a transistor of any of other various (semiconductor) process types while remaining within the scope of the present disclosure.

Figure 3B:
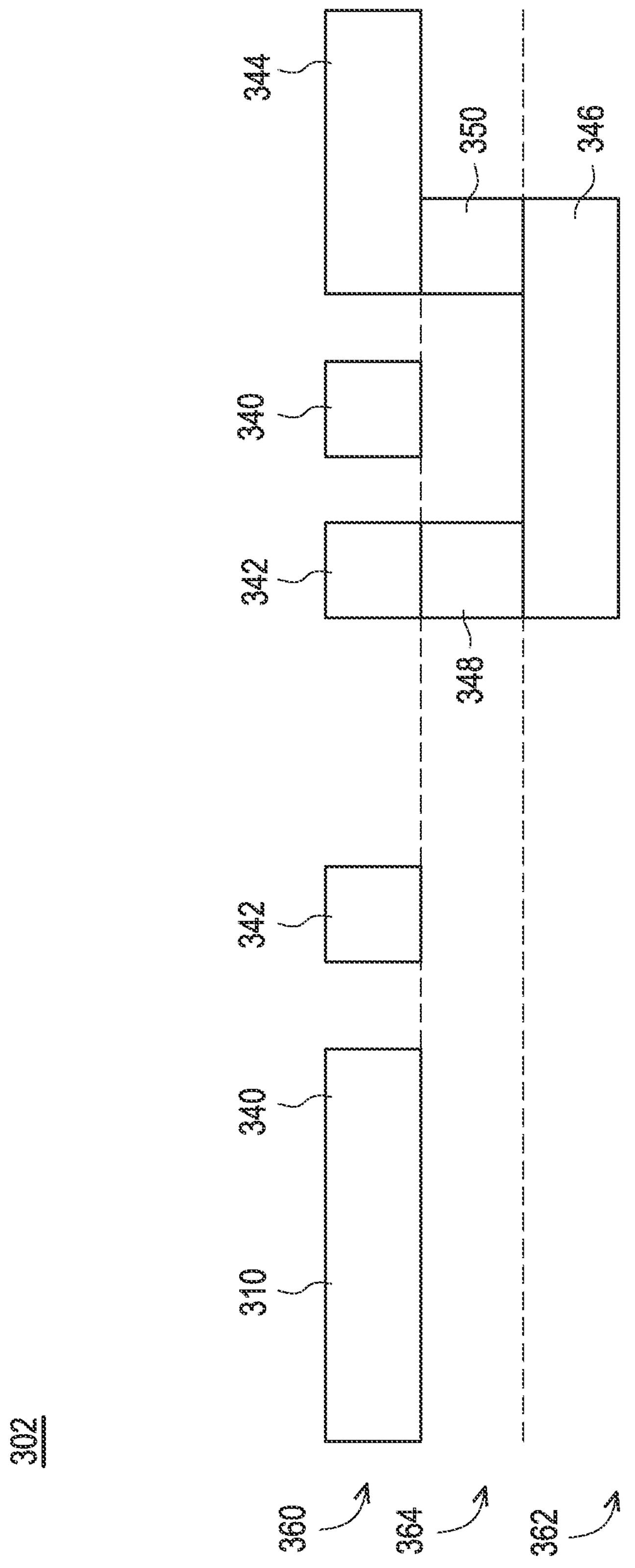
FIG. 3B illustrates a cross-sectional view of a planar inductor, in accordance with some embodiments of the present disclosure.

FIG. 3B illustrates a cross-sectional view of the planar inductor 302, in accordance with some embodiments of the present disclosure. The cross-sectional view of the planar inductor 302 is cut along A-A' in FIG. 3A. The planar inductor 302 is located at a layer 360, a layer 362, and a layer 364. The first layer 360 includes the input metal 310, the outer loop 340, the inner loop 342, the metal 344. The second layer 362 is disposed below the layer 360 and includes the underpass 346. The layer 364 is disposed in between the layer 360 and the layer 362 and includes the vias 348 and 350.

Figure 4:
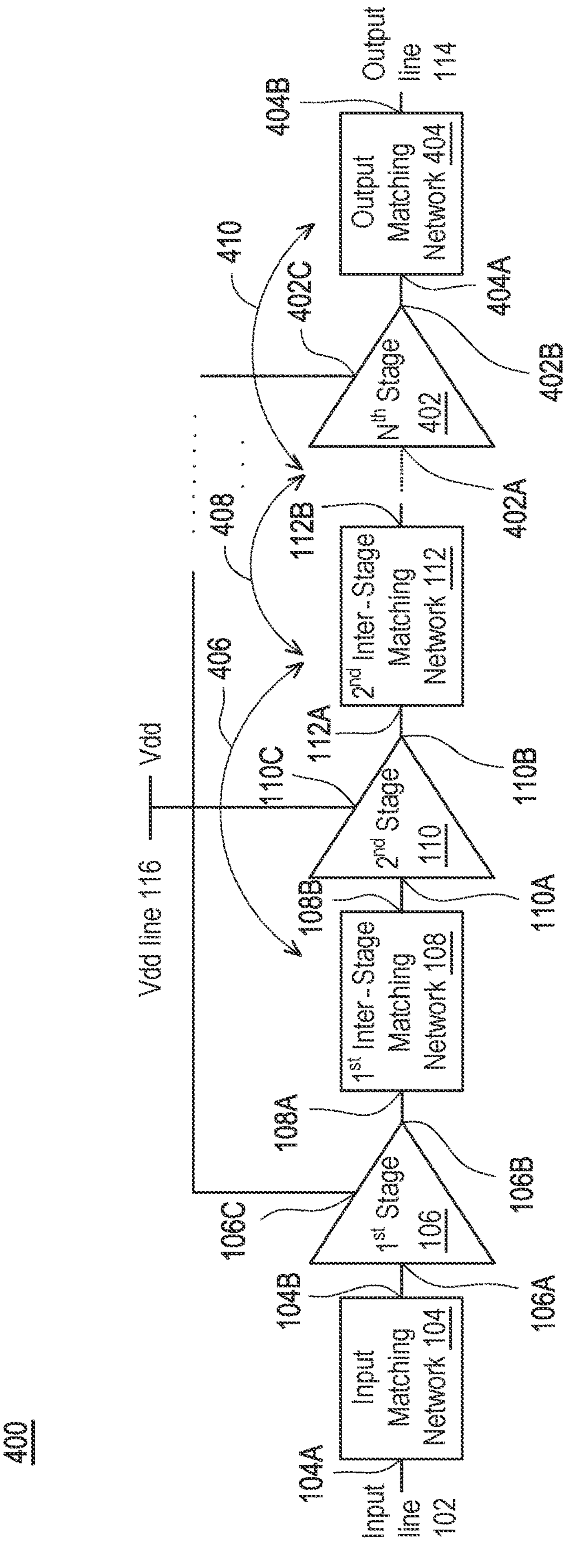
FIG. 4 illustrates a block diagram of a multi-stage amplifier system, in accordance with some embodiments of the present disclosure.

FIG. 4 illustrates a block diagram of a multi-stage amplifier system 400, in accordance with some embodiments of the present disclosure. The system 400 is similar to the system 100 except that the system 400 includes a number of amplifier stages of at least three or more. The system 400 can have a higher gain than the system 100. The inter-stage matching network 108 of FIG. 1 can be referred to as the first inter-stage matching network 108. The output matching network 112 of FIG. 1 can be referred to as the second inter-stage matching network 112, as there are now one or more additional stages after the second inter-stage matching network 112. The output port 112B of the second inter-stage matching network 112 is coupled to the next stage amplifier.

The system 400 includes an Nth-stage amplifier 402. The Nth-stage amplifier 402 includes an input port 402A that is coupled to a previous matching network, an output port 402B that is coupled to the output matching network 112, and a VDD port 402C that is coupled to the VDD line 116.

The system 400 includes an output matching network 404 coupled to the output port 110B of the second-stage amplifier 110. The output matching network 404 includes an input port 404A coupled to the Nth-stage amplifier 402 and an output port 404B coupled to the output line 114.

The system 400 includes a coupling 406 from the second inter-stage matching network 404 to the first inter-stage matching network 108, a coupling 408 from the a next matching network to the second inter-stage matching network 404, and a coupling 410 from the output matching network 112 to the previous matching network. In the embodiment where the number of amplifiers in the system 400 is three, the next matching network is the output matching network 112, the previous matching network is the second inter-stage matching network 404, and the coupling 408 is the coupling 410.

Figure 5:
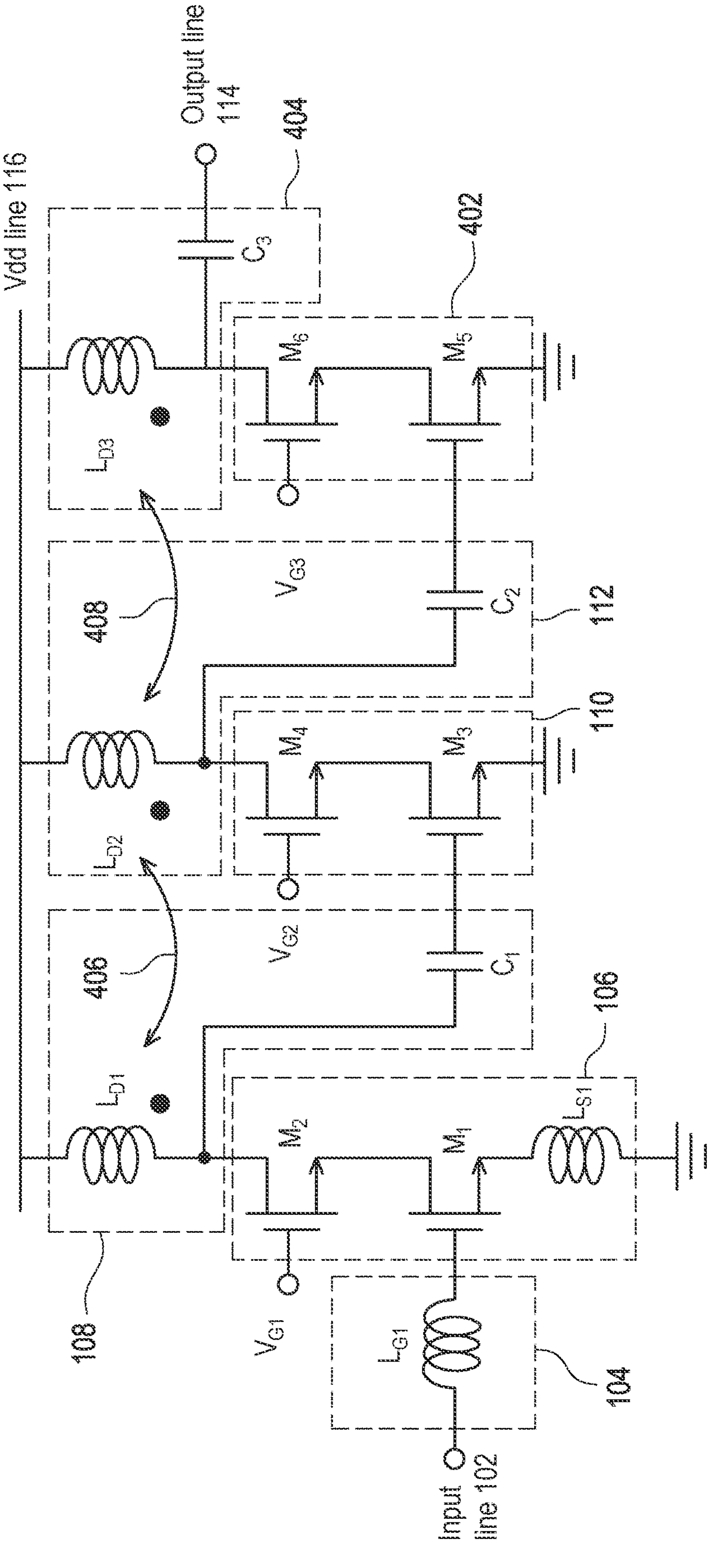
FIG. 5 illustrates a circuit diagram of a multi-stage amplifier circuit, in accordance with some embodiments of the present disclosure.

FIG. 5 illustrates a circuit diagram of a multi-stage amplifier circuit 500, in accordance with some embodiments of the present disclosure. The circuit 500 can be a circuit implementation of the system 400. The circuit 500 is similar to the circuit of 200A except that the circuit 500 includes an additional stage, which can result in a higher gain.

The circuit 500 includes the third-stage amplifier 402. The third-stage amplifier 402 includes a transistor M5 and a transistor M6. The transistor M5 includes a gate port coupled to the capacitor C2, a drain port coupled to the transistor M6, and a source port coupled to ground. The transistor M6 includes a gate port coupled to a bias line VG3, a source port coupled to the transistor M5, and a drain port coupled to the output matching network 404. The transistor M5 and/or the transistor M6 may include a substrate port. The transistor M5 and/or the transistor M6 may be a deep n-well device.

The circuit 500 includes the output matching network 404. The output matching network 404 includes an inductor LD3 and a capacitor C3. The inductor LD3 is coupled at one end to the second-stage amplifier 110 and the capacitor C3. The inductor LD3 is coupled at the other end to the VDD line 116. The capacitor C3 is coupled at a common end between the inductor LD3 and the third-stage amplifier 402.

Figure 6:
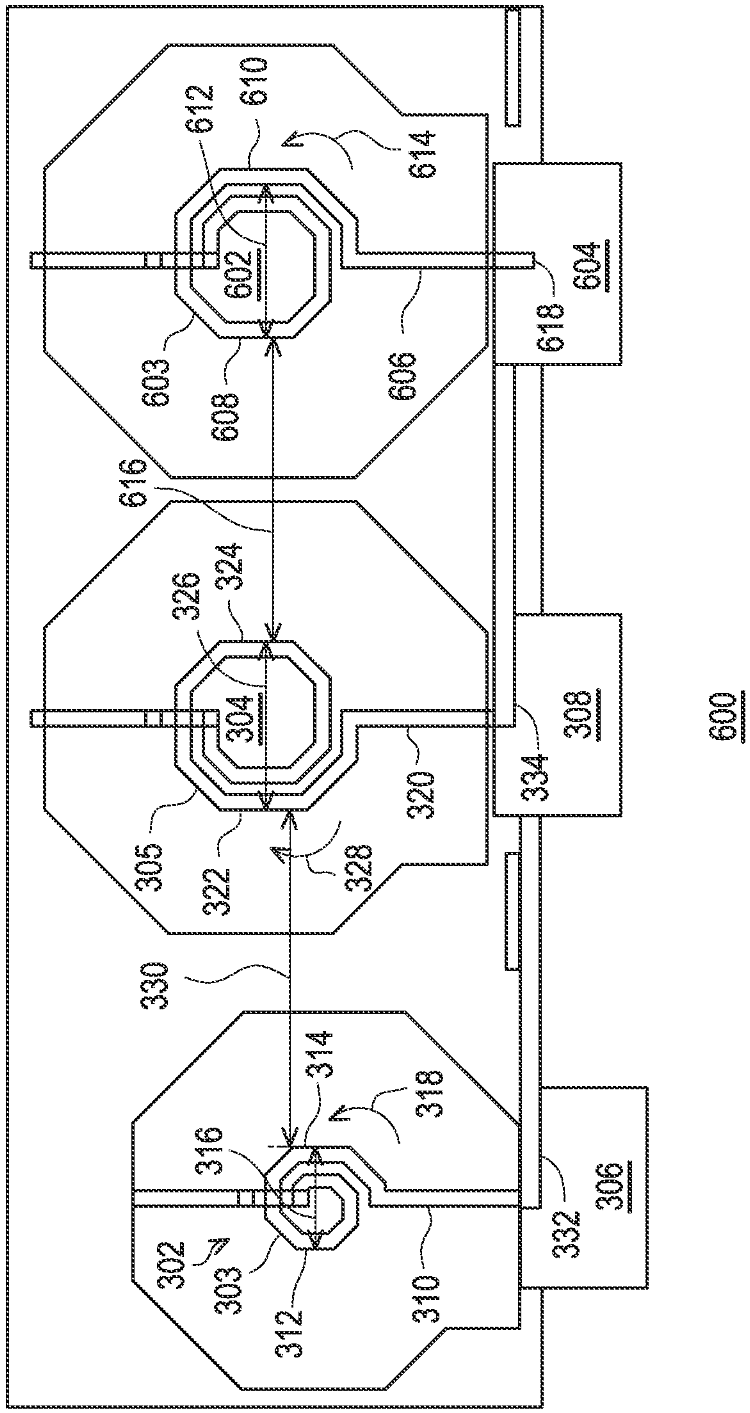
FIG. 6 illustrates a multi-stage amplifier device, in accordance with some embodiments of the present disclosure.

FIG. 6 illustrates a multi-stage amplifier device 600, in accordance with some embodiments of the present disclosure. The device 600 can be a physical implementation of the system 400 and the circuit 500. The device 600 can be similar to the device 300 except that the device 600 includes an additional stage, which can result in a higher gain.

The device 600 includes a planar inductor 602. The planar inductor 602 can be on one metal layer, except for any underpass. The planar inductors 602 can be co-planar with the planar inductors 302 and 304. That is, the planar inductors 302, 304, and 602 can be on a same metal layer (except any underpasses are on a same second metal layer). The planar inductor 602 includes a spiral portion 603 that can be described as having a spiral shape. The spiral portion 603 can be on the one metal layer. The spiral portions 303, 305, and 603 can be co-planar. The spiral portion 603 can be similar in size, shape, and material as the spiral portion 303 and/or the spiral portion 305, or can be different in size, in shape, in material, or in a combination thereof, from the spiral portions 303 and 305. In some embodiments, the planar inductor 602 includes an input metal 606 that extends in the second direction to couple to the active device 604 such that the active devices 306, 308, and 604 are on the same side of the planar inductors 302, 304, and 602. In some embodiments, the planar inductor 602 includes an input metal 606 that extends in a third direction (e.g., opposite the second direction) to couple to the active device 604 such that the active devices 306 and 308 are on an opposite side of the planar inductors 302, 304, and 602 from the active device 604. The planar inductor 304 includes an edge 608 and an edge 610 opposite the edge 608. The edge 608 faces the edge 324 of the planar inductor 304. The planar inductor 602 includes a distance 612, along the first direction from the edge 608 to the edge 610. The reference current that flows through the spiral portion 603, via the input metal 320, in a rotation direction 614. Thus, the rotation direction 614 of the spiral portion 603 is opposite of the rotation direction 328 of the spiral portion 305 (given a same direction of reference currents in the respective input metals relative to the respective spiral portions). The planar inductor 602 may be a physical embodiment of the inductor LD3 of FIG. 5.

The device 600 includes a distance 616, in a first direction between the edge 324 and the edge 608. In some embodiments, the distance 616 is in a range between 100 um and 200 um, or any other range of values while remaining in the scope of the present disclosure. In some embodiments, the distance 616 is greater than each of the distances 326 and 612, at least twice as long as each of the distances 326 and 612, or any other values relative to each of the distances 326 and 612 while still remaining in the scope of the present disclosure.

Figure 7:
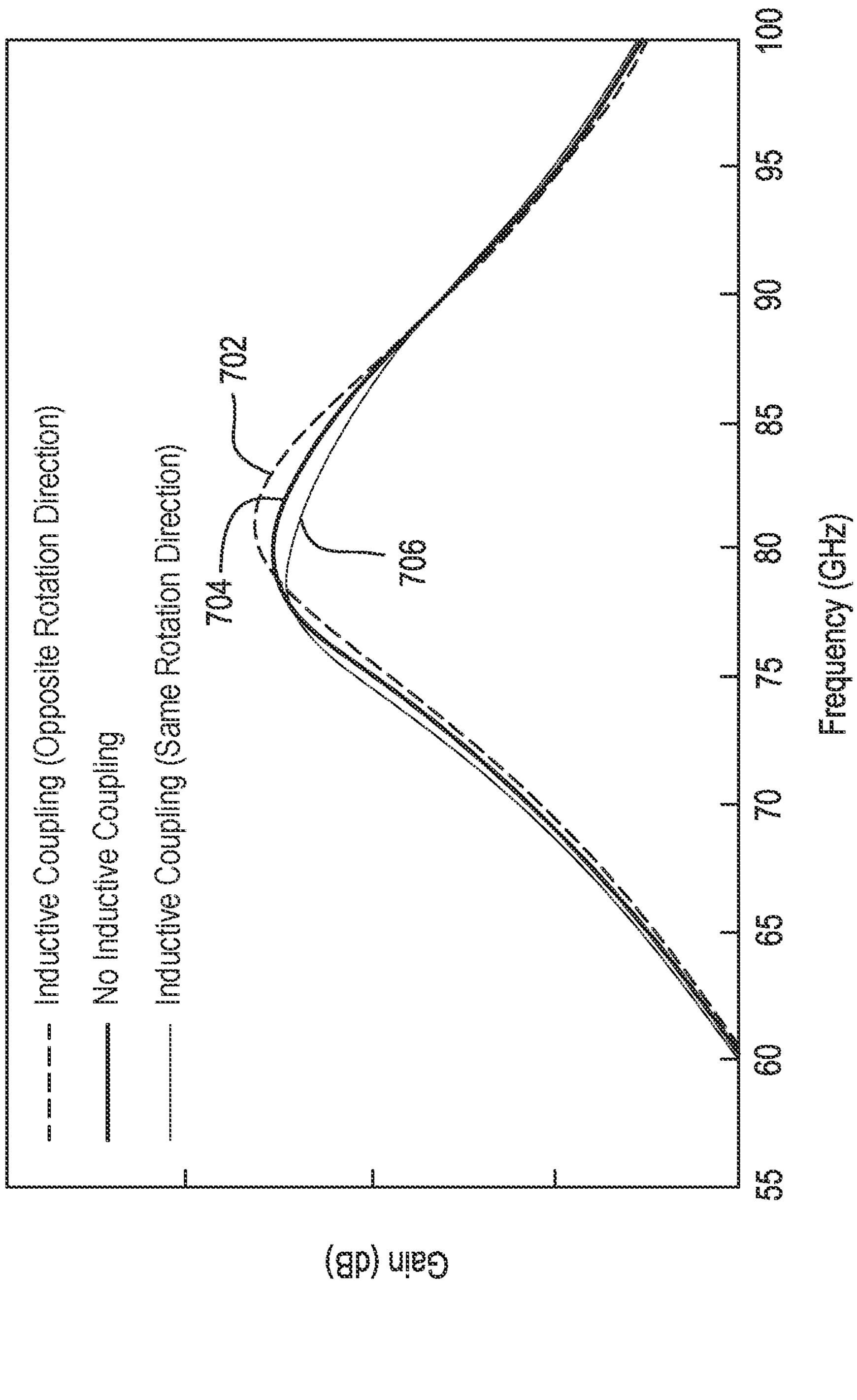
FIG. 7 illustrates a plot of a frequency response of a two-stage amplifier device, in accordance with some embodiments of the present disclosure.

FIG. 7 illustrates a plot of a frequency response 700 of a two-stage amplifier device, in accordance with some embodiments of the present disclosure. Plot line 702 represents a frequency response of an amplifier device (e.g., the system 100 and the circuit 200A/200B as embodied by the device 300 or the system 400 and the circuit 500 as embodied by the device 600), that has inductive coupling between adjacent stages/matching networks with opposite rotation direction. Plot line 704 represents a frequency response of an amplifier device with no inductive coupling between adjacent stages/matching networks. Plot line 706 represents a frequency response of an amplifier device that has inductive coupling between adjacent stages/matching networks with same rotation direction. The frequency response 700 shows that the maximum gain of the amplifier device represented by the plot line 702 is greater than each of the maximum gains of the respective amplifier devices represented by the plot lines 704 and 706, respectively.

Figure 8:
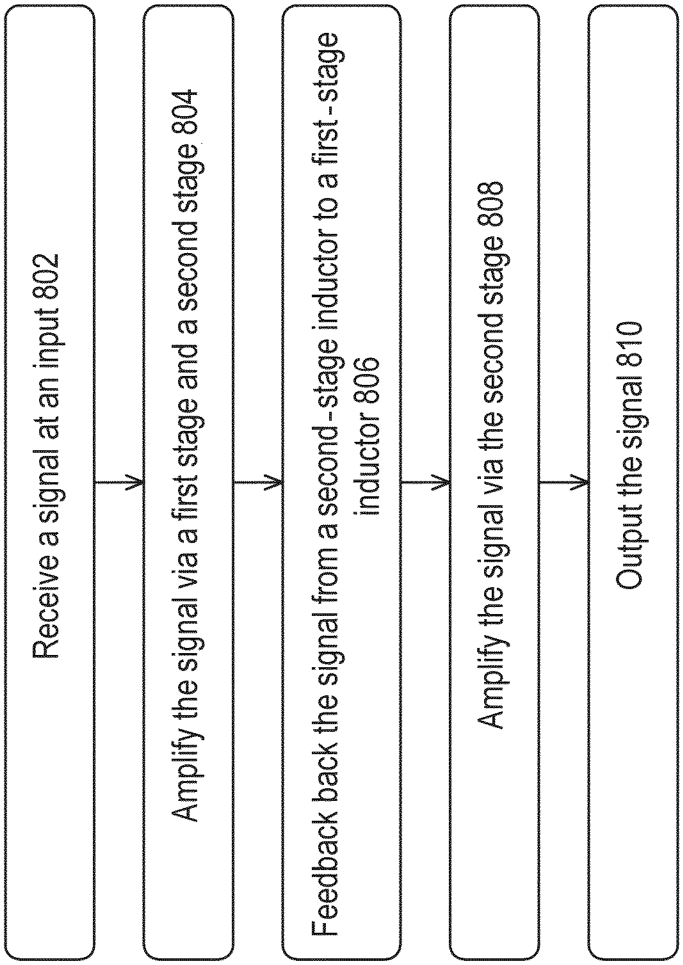
FIG. 8 illustrates a flowchart of a method to operate a two-stage amplifier device, in accordance with some embodiments of the present disclosure.

FIG. 8 illustrates a flowchart of a method 800 to operate a two-stage amplifier device, in accordance with some embodiments of the present disclosure. It is noted that the method 800 is merely an example and is not intended to limit the present disclosure. Accordingly, it is understood that additional operations may be provided before, during, and after the method 800 of FIG. 8, and that some other operations may only be briefly described herein. In some embodiments, the method 800 is performed by the system 100, the circuit 200A, the circuit 200B, the device 300, the system 400, the circuit 500, or the device 600.

At operation 802, the device (e.g., the circuit 200) receives a signal at an input (e.g., the input line 102). At operation 804, the device amplifies the signal via a first stage (e.g., the first-stage amplifier 106) and a second stage (e.g., the second-stage amplifier 110). In some embodiments, the device receives the signal amplified by the second stage at an inductor (e.g., the inductor LD2) coupled to the output of the second stage, which can be referred to as a second-stage inductor. At operation 806, the device feeds back the signal from the second-stage inductor to an inductor (e.g., the inductor LD1) coupled to the output of the first stage, which can be referred to as a first-stage inductor. In some embodiments, the signal combines in-phase, or substantially in-phase, with a second signal provided by the first stage. At operation 808, the device amplifies the combined signal (e.g., a combination of the signal and the second signal) via the second stage. At operation 810, the device outputs the combined signal.

In some embodiments, the device amplifies the signal via a third stage. In some embodiments, the device receives the signal amplified by the third stage at a third-stage inductor (e.g., LD3) coupled to the output of the third stage. In some embodiments, the device feeds back the signal from the third-stage inductor to the second-stage inductor. In some embodiments, the signal combines in-phase, or substantially in-phase, with a third signal provided by the second stage. The third signal can be the combined signal from above. In some embodiments, the device amplifies and outputs the second combined signal (e.g., a combination of the signal and the combined signal).

One or more of the transistors in FIGS. 1-8 can be an on-chip transistor, a discrete component transistor, a metal-oxide-semiconductor (MOS) field-effect transistor (FET) (MOSFET), complementary MOS (CMOS), a finFET, a junction-gate FET (JFET), a bipolar transistor (BJT), or any other (technology) type of transistor while remaining the scope of the present disclosure. In some embodiments, one or more of the transistors in FIGS. 1-8 is an n-type MOS (NMOS) transistor. In some embodiments, an advantage of using NMOS transistors for the first and second transistors is that the read and write operations are faster because an NMOS device is faster than a PMOS device. Specifically, in some embodiments, the mobility of electrons, which are carriers in the case of an NMOS transistor, is about two times greater than that of holes, which are the carriers of the PMOS transistor. One or more of the transistors in FIGS. 1-8 can be any of other various transistor types while remaining within the scope of the present disclosure. One or more of the transistors in FIGS. 1-8 can have a MOS device type of standard threshold voltage (SVT), low threshold voltage (LVT), high threshold voltage (HVT), high voltage (HV), input/output (IO), or any of various other MOS device types.

One or more of the inductors in FIGS. 1-8 can be an on-chip inductor, a discrete component inductor, a passive inductor, a MOS inductor, a transformer, or any other type of inductor, while remaining within the scope of the present disclosure. One or more of the capacitors in FIGS. 1-8 can be an on-chip capacitor, a discrete component capacitor, a passive capacitor, MOS capacitor, a metal-on-metal (MOM) capacitor, a metal-insulate-metal (MIM) capacitor, or any other type of capacitor while remaining the scope of the present disclosure.

In some aspects of the present disclosure, a millimeter-wave amplifier circuit is disclosed. The millimeter-wave amplifier circuit includes a first amplifier, a first inductor coupled to an output of the first amplifier, a second amplifier coupled to the output of the first amplifier, and a second inductor coupled to an output of the second amplifier. The second inductor electro-magnetically couples to the first inductor to send a first signal substantially in-phase with a second signal generated at the output of the first amplifier.

In some embodiments, the millimeter-wave amplifier circuit includes a frequency of operation between 10 Gigahertz (GHz) and 100 GHz. In some embodiments, the first inductor and the second inductor have a coupling factor in a range from 0.01 to 0.05.

In some embodiments, the first inductor is part of a matching network that transforms a first impedance of the output of the first amplifier to a second impedance of an input of the second amplifier. In some embodiments, the millimeter-wave amplifier circuit includes a matching network coupled to an input of the first amplifier.

In some embodiments, the first amplifier includes a first transistor and the second amplifier includes a second transistor. In some embodiments, the first amplifier further includes a third inductor coupled to a source of the first transistor. In some embodiments, the first amplifier includes a third transistor coupled to an output of the first transistor and the second amplifier includes a fourth transistor coupled to an output of the second transistor. In some embodiments, the third transistor and the fourth transistor are deep n-well transistors.

In some embodiments, the millimeter-wave amplifier circuit includes a third amplifier coupled to the output of the second amplifier, and a third inductor coupled to an output of the third amplifier. In some embodiments, the third inductor electro-magnetically couples to the second inductor to send a third signal substantially in-phase with the first signal.

In some aspects of the present disclosure, a semiconductor device is disclosed. The semiconductor device includes a first active device and a first planar inductor coupled to an output metal of the first active device. The first planar inductor includes a first edge, a second edge opposite the first edge, and a first distance from the first edge to the second edge. The semiconductor device includes a second active device coupled to the output metal of the first active device and a second planar inductor coupled to an output metal of the second active device. The second planar inductor includes a third edge, a fourth edge opposite the third edge, and a second distance from the third edge to the fourth edge. The third edge is facing the second edge. A third distance between the second edge and the third edge is greater than the first distance and the second distance.

In some embodiments, the first planar inductor and the second planar inductor are co-planar. In some embodiments, the first planar inductor has a first spiral shape and a first rotation direction and the second planar inductor has a second spiral shape and a second rotation direction opposite the first rotation direction.

In some embodiments, an input metal of the first planar inductor extends in a first direction to couple to the output metal first active device and an input metal of the second planar inductor extends in the first direction to couple to the second active device. In some embodiments, the third distance is at least twice the first distance and at least twice the second distance.

In some embodiments, the semiconductor device includes third active device coupled to an output metal of the second planar inductor and a third planar inductor coupled to an output metal of the third active device. In some embodiments, the third planar inductor includes a fifth edge, a sixth edge opposite the fifth edge, and a fourth distance from the fifth edge to the sixth edge. In some embodiments, the fifth edge is facing the fourth edge. In some embodiments, a fifth distance between the fourth edge and the fifth edge is greater than the second distance and the fourth distance. In some embodiments, the second planar inductor and the third planar inductor are co-planar. In some embodiments, the second planar inductor has a first spiral shape and a first rotation direction and the third planar inductor has a second spiral shape and a second rotation direction opposite the first rotation direction.

In some aspects of the present disclosure, a method of operating a multi-stage device includes receiving a signal at an input, amplifying the signal via a first stage and a second stage, feeding back the signal, from a second-stage inductor coupled to an output of the second stage, to a first-stage inductor coupled to an output of the third stage, and outputting a combined signal. In some embodiments, the signal combines in-phase, or substantially in-phase, with a second signal provided by the first stage to generate the combined signal.

In some embodiments, the method includes amplifying the signal via a third stage and feeding back the signal, from a third-stage inductor coupled to an output of the third stage, to the second stage and outputting a second combined signal. In some embodiments, the signal combines in-phase, or substantially in-phase, with the combined signal provided by the first stage to generate the second combined signal In some aspects of the present disclosure, a system includes an input matching network, a first-stage amplifier coupled to the input matching network, an inter-stage matching network coupled to the first-stage amplifier, a second-stage amplifier coupled to the inter-stage matching network, and an output matching network coupled to the second-stage amplifier and feedback-coupled to the inter-stage matching network. A gain of the second-stage amplifier with the output matching network feedback-coupled to the inter-stage matching network is greater than a gain of the second-stage amplifier without the output matching network feedback-coupled to the inter-stage matching network.

In some embodiments, the input matching network includes a first inductor, the inter-stage matching network includes a second inductor and a first capacitor coupled to the second inductor, and the output matching network includes a third inductor and a second capacitor coupled to the third inductor.

In some embodiments, the third inductor is feedback-coupled to the second inductor. In some embodiments, the first-stage amplifier includes a first transistor, a second transistor coupled to the first transistor, and an inductor coupled to a source of the first transistor. In some embodiments, the second-stage amplifier includes a first transistor, a second transistor coupled to the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A millimeter-wave amplifier circuit comprising:
   - a first amplifier including a plurality of transistors, wherein a gate port of one of the plurality of transistors is not biased by any voltage;
   - a first inductor coupled to an output of the first amplifier;
   - a second amplifier coupled to the output of the first amplifier; and
   - a second inductor coupled to an output of the second amplifier,
   - wherein a source port of the second amplifier is directly connected to ground,
   - wherein a drain port of the first amplifier and a drain port of the second amplifier are directly connected to a common voltage supply line through the first inductor and the second inductor, respectively,
   - wherein the gate port of the one of the plurality of transistors of the first amplifier is configured to receive a single input radio frequency (RF) signal through an input matching network and the drain port of the second amplifier is configured to provide a single output RF signal, and wherein the second inductor electro-magnetically couples to the first inductor to send a first signal substantially in-phase with a second signal generated at the output of the first amplifier.

2. The circuit of claim 1, further comprising a frequency of operation between 10 Gigahertz (GHz) and 100 GHz.

3. The circuit of claim 1, wherein the first inductor and the second inductor have a coupling factor in a range from 0.01 to 0.05.

4. The circuit of claim 1, wherein the first inductor is part of a matching network that transforms a first impedance of the output of the first amplifier to a second impedance of an input of the second amplifier.

5. The circuit of claim 1, further comprising a matching network coupled to an input of the first amplifier.

6. The circuit of claim 1, wherein the first amplifier comprises a first transistor and the second amplifier comprises a second transistor.

7. The circuit of claim 6, wherein the first amplifier further comprises a third inductor coupled to a source of the first transistor.

8. The circuit of claim 6, wherein the first amplifier comprises a third transistor coupled to an output of the first transistor and the second amplifier comprises a fourth transistor coupled to an output of the second transistor.

9. The circuit of claim 8, wherein the third transistor and the fourth transistor are deep n-well transistors.

10. The circuit of claim 1, further comprising:

a third amplifier coupled to the output of the second amplifier; and a third inductor coupled to an output of the third amplifier, wherein the third inductor electro-magnetically couples to the second inductor to send a third signal substantially in-phase with the first signal.

11. A circuit comprising:

a first amplifier comprising a first transistor and a second transistor;

a first inductor coupled to the first amplifier;

a second amplifier coupled to the first amplifier and comprising a third transistor and a fourth transistor; and a second inductor coupled to the second amplifier, wherein a source port of the third transistor of the second amplifier is directly connected to ground, wherein a drain port of the second transistor of the first amplifier and a drain port of the fourth transistor of the second amplifier are directly connected to a common voltage supply line through the first inductor and the second inductor, respectively, wherein a gate port of the first transistor of the first amplifier is configured to receive a single input radio frequency (RF) signal through an input matching network and not biased by any voltage, and the drain port of the fourth transistor of the second amplifier is configured to provide a single output RF signal, wherein the second inductor is configured to electro-magnetically couple to the first inductor, so as to send a first signal substantially in-phase with a second signal generated at an output of the first amplifier.

12. The circuit of claim 11, wherein the circuit is configured to operate with a frequency between 10 Gigahertz (GHz) and 100 GHz.

13. The circuit of claim 11, wherein the first inductor and the second inductor have a coupling factor in a range from 0.01 to 0.05.

14. The circuit of claim 11, wherein the first inductor is part of a matching network that transforms a first impedance of the output of the first amplifier to a second impedance of an input of the second amplifier.

15. The circuit of claim 11, further comprising a matching network coupled to an input of the first amplifier.

16. The circuit of claim 11, wherein the first amplifier further comprises a third inductor coupled between a source of the first transistor and ground.

17. The circuit of claim 11, wherein the first inductor includes a first spiral portion, and the second inductor includes a second spiral portion.

18. The circuit of claim 17, wherein a distance between an edge of the first spiral portion and an edge of the second spiral portion is in a range between 100 um and 200 um.

19. A circuit comprising:

a first amplifier comprising a first transistor and a second transistor;

a first inductor coupled to the first amplifier;

a second amplifier coupled to the first amplifier and comprising a third transistor and a fourth transistor;

a second inductor coupled to the second amplifier;

a third amplifier coupled to the second amplifier; and a third inductor coupled to the third amplifier, wherein a source port of the third transistor of the second amplifier and a source port of the third amplifier are each directly connected to ground, wherein a drain port of the second transistor of the first amplifier, a drain port of the fourth transistor of the second amplifier, and a drain port of the third amplifier are directly connected to a common voltage supply line through the first inductor, the second inductor, and the third inductor, respectively, wherein a gate port of the first transistor of the first amplifier is configured to receive a single input radio frequency (RF) signal through an input matching network and not biased by any voltage, and the drain port of the third amplifier is configured to provide a single output RF signal, wherein the second inductor is configured to electro-magnetically couple to the first inductor, so as to send a first signal substantially in-phase with a second signal generated at an output of the first amplifier, and the third inductor is configured to electro-magnetically couple to the second inductor to send a third signal substantially in-phase with the first signal.

20. The circuit of claim 19, wherein the first inductor includes a first spiral portion, the second inductor includes a second spiral portion, and the third inductor includes a third spiral portion, and wherein a first distance between an edge of the first spiral portion and an edge of the second spiral portion is in a range between 100 um and 200 um, and a second distance between an edge of the second spiral portion and an edge of the third spiral portion is in a range between 100 um and 200 um.

* * * * *